United States Patent
Lim (10) Patent No.: US 12,310,197 B2
(45) Date of Patent: May 20, 2025

(54) DISPLAY DEVICE WITH DATA LINK LINE IN ACTIVE AREA

(71) Applicant: LG Display Co., Ltd., Seoul (KR)

(72) Inventor: ByungJun Lim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/371,237

(22) Filed: Sep. 21, 2023

(65) Prior Publication Data

US 2024/0224646 A1 Jul. 4, 2024

(30) Foreign Application Priority Data

Dec. 30, 2022 (KR) .................. 10-2022-0190696

(51) Int. Cl.
*H10K 59/131* (2023.01)
*G09G 3/3258* (2016.01)
(Continued)

(52) U.S. Cl.
CPC ......... *H10K 59/131* (2023.02); *G09G 3/3258* (2013.01); *G09G 3/3291* (2013.01);
(Continued)

(58) Field of Classification Search
CPC .. G09G 3/3291; G09G 3/3233; G09G 3/3258; G09G 2300/0842;
(Continued)

(56) References Cited

U.S. PATENT DOCUMENTS

2006/0066255 A1 3/2006 Lee et al.
2010/0176381 A1* 7/2010 Yagi ................. H10K 19/10
257/40
(Continued)

FOREIGN PATENT DOCUMENTS

CN 108447887 A 8/2018
CN 109697958 B 11/2020
(Continued)

OTHER PUBLICATIONS

Notice of Reasons for Rejection issued Apr. 23, 2024 for Japanese Patent Application No. 2023-161819.
(Continued)

*Primary Examiner* — Yaron Cohen
(74) *Attorney, Agent, or Firm* — Morgan, Lewis & Bockius LLP (57) ABSTRACT

A display device includes a substrate including an active area including a plurality of sub-pixels and a non-active area, a plurality of light emitting elements disposed in the plurality of sub-pixels, a plurality of data lines disposed in the active area, a plurality of data link lines disposed in the active area and transmitting a data voltage to the plurality of data lines, driving transistors disposed in the plurality of sub-pixels and a shielding layer disposed over the driving transistors, wherein the shielding layer is connected to a gate electrode of the driving transistor and is disposed to overlap a conductive layer having the same potential as the gate electrode of the driving transistor. Therefore, the occurrence of spots on a screen due to a parasitic capacitance can be reduced in the display device.

13 Claims, 7 Drawing Sheets

(51) Int. Cl.
  *G09G 3/3291* (2016.01)
  *H10K 59/121* (2023.01)
  *H10K 59/126* (2023.01)

(52) U.S. Cl.
  CPC ... *H10K 59/126* (2023.02); *G09G 2300/0842* (2013.01); *G09G 2310/0262* (2013.01); *G09G 2310/08* (2013.01); *G09G 2320/0214* (2013.01); *G09G 2330/06* (2013.01); *H10K 59/1213* (2023.02); *H10K 59/1216* (2023.02)

(58) Field of Classification Search
  CPC ... G09G 2310/0262; G09G 2320/0214; G09G 2310/08; G09G 2300/0426; G09G 2300/0819; G09G 2330/06; H10K 59/126; H10K 59/131; H10K 59/1213; H10K 59/1216
  See application file for complete search history.

(56) References Cited

U.S. PATENT DOCUMENTS

| | | | |
|---|---|---|---|
| 2017/0345877 A1* | 11/2017 | Hwang | ............ H10K 59/131 |
| 2019/0081128 A1 | 3/2019 | Yu et al. | |
| 2019/0088198 A1 | 3/2019 | Kang et al. | |
| 2020/0044006 A1 | 2/2020 | Lee et al. | |
| 2020/0312252 A1 | 10/2020 | Jeong et al. | |
| 2022/0336565 A1 | 10/2022 | Cho et al. | |

FOREIGN PATENT DOCUMENTS

| | | |
|---|---|---|
| JP | 2008-171907 A | 7/2008 |
| JP | 2020-166239 A | 10/2020 |
| KR | 2014-0081662 A1 | 7/2014 |
| KR | 10-2018-0062897 A | 6/2018 |
| KR | 10-2018-0074164 A | 7/2018 |
| TW | 200620213 A | 6/2006 |

OTHER PUBLICATIONS

Office Action issued in corresponding TW Application No. 112137176, dated Aug. 9, 2024. (Note: CN 109697958 B was previously cited).

Extended European Search Report issued in EP Application No. 23199343.7 dated on Feb. 27, 2024.

JP office Action issued in corresponding JP application 2023-161819 dated Aug. 23, 2024.

* cited by examiner

DISPLAY DEVICE WITH DATA LINK LINE IN ACTIVE AREA

CROSS-REFERENCE TO RELATED APPLICATIONS

This application claims the benefit of and priority to Korean Patent Application No. 10-2022-0190696 filed on Dec. 30, 2022, in the Republic of Korea, the entire contents of which are hereby expressly incorporated by reference into the present application.

BACKGROUND

Technical Field

The present disclosure relates to a display device, and more particularly, to a display device in which screen spots due to a parasitic capacitance are reduced.

Discussion of the Related Art

Display devices used in computer monitors, TVs, and mobile phones include organic light emitting displays (OLEDs) that emit light by themselves, and liquid crystal displays (LCDs) that require a separate light source.

Display devices are being applied to more and more various fields of application including not only computer monitors and TVs, but also personal mobile devices, and thus, display devices having a reduced volume and weight while having a wide active area are being studied.

Meanwhile, a printed circuit board bonded to a substrate is disposed on one side of the display device. An area in which the printed circuit board is disposed is an area in which actual images are not displayed, and when the printed circuit board is disposed on a front surface of the display device, a bezel is required to cover the area. Accordingly, to minimize such a bezel area, a technique of bending one side of a substrate on which a printed circuit board is disposed toward a rear surface of the substrate has been developed.

SUMMARY

Accordingly, embodiments of the present disclosure are directed to a display device that substantially obviates one or more of the problems due to limitations and disadvantages of the related art.

An aspect of the present disclosure is to provide a display device having a reduced bezel area by disposing link lines in an active area.

Another aspect of the present disclosure is to provide a display device in which a parasitic capacitance generated between a link line and a driving transistor in an active area of the display device is reduced.

Still another aspect of the present disclosure is to provide a display device in which screen spots generated in an area in which link lines are disposed are reduced.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a substrate including an active area including a plurality of sub-pixels and a non-active area, a plurality of light emitting elements disposed in the plurality of sub-pixels, a plurality of data lines disposed in the active area, a plurality of data link lines disposed in the active area and transmitting a data voltage to the plurality of data lines, driving transistors disposed in the plurality of sub-pixels and a shielding layer disposed over the driving transistors, wherein the shielding layer is connected to a gate electrode of the driving transistor and is disposed to overlap a conductive layer having the same potential as the gate electrode of the driving transistor. Therefore, the occurrence of spots on a screen can be reduced in the display device.

Other detailed matters of the exemplary embodiments are included in the detailed description and the drawings.

According to the present disclosure, a bezel area can be reduced by disposing a link line positioned between the bending area and an active area in the active area.

According to the present disclosure, a parasitic capacitance generated in a driving transistor can be shielded.

According to the present disclosure, reliability of a display device can be improved by reducing a luminance deviation that may occur due to a change in voltage of a link line disposed in an active area.

It is to be understood that both the foregoing general description and the following detailed description are exemplary and explanatory and are intended to provide further explanation of the inventive concepts as claimed.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 1:
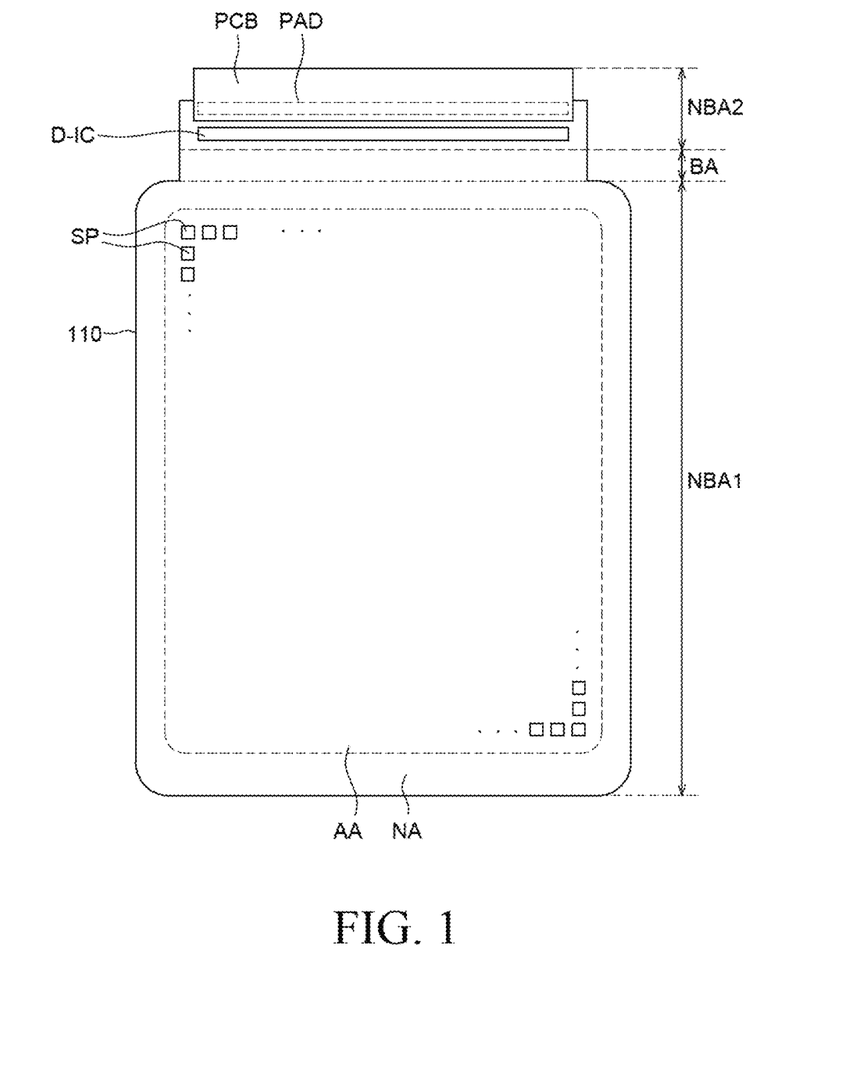
FIG. 1 is a plan view of a display device according to an exemplary embodiment of the present disclosure.

FIG. 1 is a schematic plan view of a display device according to an exemplary embodiment of the present disclosure. In FIG. 1, only a substrate 110, a pad part PAD, a driver integrated circuit D-IC, a printed circuit board PCB, and a plurality of sub-pixels SP are illustrated for convenience of description.

Referring to FIG. 1, a display device 100 includes the substrate 110, the pad part PAD, a gate driver, the driver integrated circuit D-IC, and the printed circuit board PCB.

An active area AA and a non-active area NA surrounding the active area AA may be defined on the substrate 110. The active area AA is an area in which an image is actually displayed in the display device 100, and light emitting elements, which will be described later, and various driving elements for driving the light emitting elements may be disposed in the active area AA. The non-active area NA is an area in which an image is not displayed and may be defined as an area surrounding the active area AA. Various elements for driving the plurality of sub-pixels SP disposed in the active area AA may be disposed in the non-active area NA.

Referring to FIG. 1, the substrate 110 may include a first non-bending area NBA1, a bending area BA extending and bent from one side of the active area AA, and a second non-bending area NBA2 extending from one side of the bending area BA and including the non-active area NA. The first non-bending area NBA1 is an area that corresponds to the active area AA where the plurality of sub-pixels SP are disposed, and maintains a flat state. The second non-bending area NBA2 is an area opposite to the first non-bending area NBA1, and is an area where circuit elements such as the printed circuit board PCB connected to the pad part PAD and the driver integrated circuit D-IC are disposed and that maintains a flat state.

The bending area BA is an area that maintains a bent state. Meanwhile, notches formed by cutting both edges of the substrate 110 in the bending area BA of the substrate 110 may be disposed. For example, notches may be formed by cutting both side surfaces of the substrate 110 in a process of cutting a mother substrate into a unit of panels. Accordingly, an area of the substrate 110 disposed in the bending area BA may be relatively reduced, so that stress applied to the substrate 110 may be reduced. Meanwhile, in order to prevent propagation of cracks that may occur during the cutting process, a crack prevention structure may be disposed inside the substrate 110 along the cutting surface including the notches.

The pad part PAD is disposed in the second non-bending area NBA2. The pad part PAD may be electrically connected to the printed circuit board PCB to receive external power and data driving signals or to exchange touch signals. Accordingly, various driving signals such as driving signals and data voltages may be supplied to the driver integrated circuit D-IC through the pad part PAD.

The driver integrated circuit D-IC may be disposed in the second non-bending area NBA2. The driver integrated circuit D-IC may provide data signals to the plurality of sub-pixels SP. For example, the driver integrated circuit D-IC may sample and latch a data signal supplied from a timing controller in response to a data timing control signal supplied from the timing controller, convert the data signal into a gamma reference voltage, and output it. The driver integrated circuit D-IC may output the data signal through a plurality of data lines.

As the bending area BA is bent, the printed circuit board PCB connected to the pad part PAD and the driver integrated y move to a rear side of the substrate 110 and overlap the first non-bending area NBA1. Accordingly, circuit elements such as the printed circuit board PCB connected to the pad part PAD, and the driver integrated circuit D-IC may not be visually recognized when viewed from above the substrate 110. In addition, as the bending area BA is bent, a size of the non-active area NA visually recognized from above the substrate 110 is reduced, so that a narrow bezel may be realized.

The gate driver may be disposed in the non-active area NA of the first non-bending area NBA1. The gate driver is disposed on a side surface of the active area AA and outputs gate signals and emission control signals under a control of the timing controller, and may select the sub-pixel SP that is charged with a data voltage through lines such as a gate line and an emission control signal line, and adjust an emission timing. The gate driver may shift scan signals and the emission control signals using a shift register and sequentially supply the gate signals and the emission control signals. The gate driver may be directly formed on the substrate 110 by a gate-driver in panel (GIP) method, but is not limited thereto.

A plurality of high potential power supply lines VDDL may be disposed in the first non-bending area NBA1. The high potential power supply line is a line that transmits a high potential power supply voltage to each of the plurality of sub-pixels SP. The plurality of high potential power supply lines VDDL may include a first high potential power supply line VDDL1, a second high potential power supply line VDDL2 disposed on the first high potential power supply line, and a third high potential power supply line VDDL3 disposed on the second high potential power supply line.

The plurality of data lines connected to the driver integrated circuit D-IC and extending to the bending area BA and the first non-bending area NBA1 may be disposed. The plurality of data lines may transmit signals applied to the driver integrated circuit D-IC to the sub-pixels SP disposed in the active area AA.

A plurality of gate link lines connecting the driver integrated circuit D-IC and the gate driver may be disposed in the first non-bending area NBA1. The gate link line may transfer external power from the pad part PAD to the gate driver disposed in the first non-bending area NBA1. Hereinafter, a detailed description of the plurality of data lines will be referred with FIG. 2.

Figure 2:
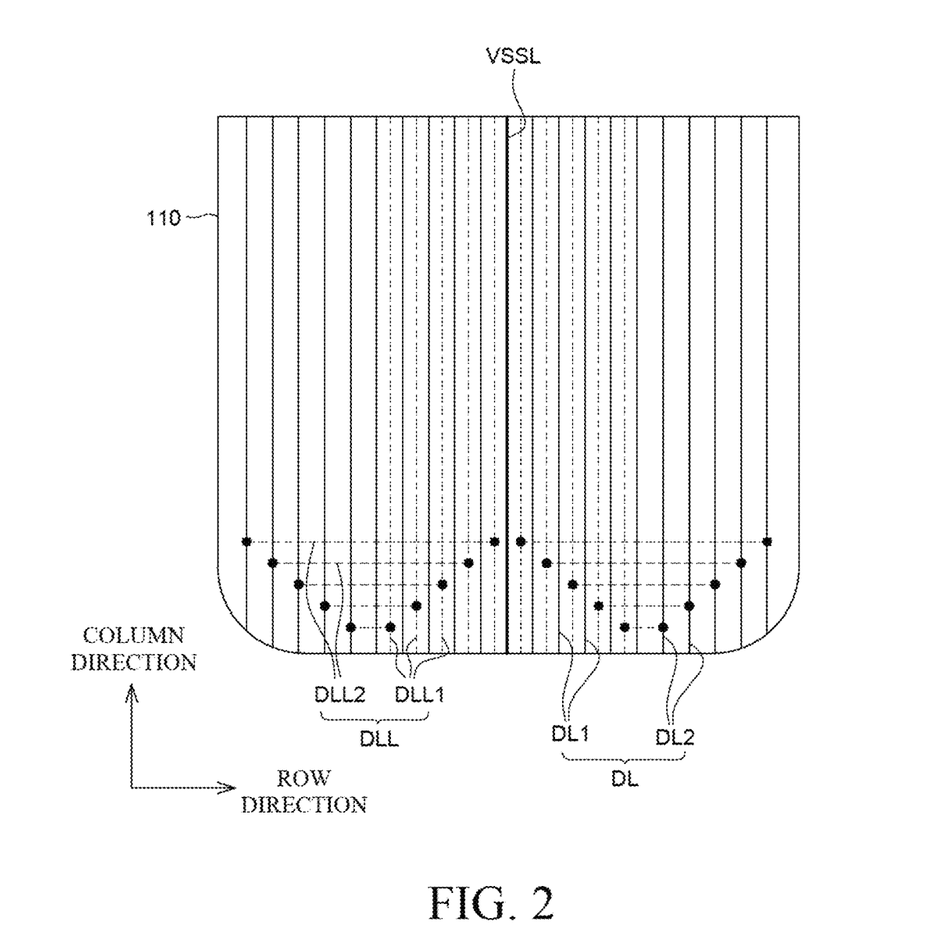
FIG. 2 is a schematic plan view of an active area of the display device according to an exemplary embodiment of the present disclosure.

FIG. 2 is a schematic plan view of an active area of the display device according to an exemplary embodiment of the present disclosure. In FIG. 2, only the substrate 110, a low potential power supply line VSSL, and a plurality of data lines DL among various components of the display device 100 are illustrated for convenience of description.

Referring to FIG. 2, the plurality of data lines DL include a plurality of first data lines DL1, a plurality of second data lines DL2, and a plurality of data link lines DLL.

Referring to FIG. 2, the plurality of data link lines DLL are disposed in the active area AA. The plurality of data link lines DLL include the plurality of first portions DLL1 disposed between the plurality of first data lines DL1 and the plurality of second portions DLL2 connected to the plurality of first portions DLL1 and disposed in a direction crossing the plurality of data lines DL the feature.

Referring to FIG. 2, the low potential power supply line VSSL is disposed on the substrate 110. The low potential power supply line VSSL may be electrically connected to cathodes of the light emitting elements of the plurality of sub-pixels SP. The low potential power supply line VSSL may be disposed to extend in a column direction in the active area AA. For example, the low potential power supply line VSSL may be disposed between first data lines DL1 and first portions DLL1 at a central portion of the substrate 110. Meanwhile, although not illustrated in FIG. 2, a low potential power link line connected to the low potential power supply line VSSL may be disposed. The low potential power link line may be disposed in a row direction in the active area AA and electrically connected to the cathodes of the light emitting elements of the plurality of sub-pixels SP, but the present disclosure is not limited thereto.

The plurality of first data lines DL1 may be disposed in the form of straight lines between the driver integrated circuit D-IC and the active area AA. Accordingly, the plurality of first data lines DL1 may be disposed in an area corresponding to a width of the driver integrated circuit D-IC. For example, when the driver integrated circuit D-IC is disposed in the central portion of the substrate 110, the plurality of first data lines DL1 are disposed in the central portion of the substrate 110 and may not be disposed outside the substrate 110.

The plurality of first data lines DL1 may be connected to the plurality of sub-pixels SP without separate link lines. That is, the plurality of first data lines DL1 may extend from the driver integrated circuit D-IC and be directly connected to the plurality of sub-pixels SP.

The plurality of second data lines DL2 are disposed outside the plurality of first data lines DL1. For example, when the plurality of first data lines DL1 are disposed in the central portion of the substrate 110, the plurality of second data lines DL2 may be disposed in an outer portion of the substrate 110.

The plurality of second data lines DL2 may be connected to the plurality of sub-pixels SP through the plurality of data link lines DLL. That is, the plurality of second data lines DL2 may be connected to the plurality of sub-pixels SP through the plurality of data link lines DLL extending from the driver integrated circuit D-IC.

The plurality of first portions DLL1 are disposed to extend from the driver integrated circuit D-IC. The plurality of first portions DLL1 may be disposed in the form of straight lines between the driver integrated circuit D-IC and the active area AA. For example, the plurality of first portions DLL1 may be disposed between the plurality of first data lines DL1 in an area corresponding to the width of the driver integrated circuit D-IC. Accordingly, when the driver integrated circuit D-IC is disposed in the central portion of the substrate 110, the plurality of first portions DLL1 are disposed in the central portion of the substrate 110 and may not be disposed in the outer portion of the substrate 110.

The plurality of second portions DLL2 are disposed in a direction crossing the first data lines DL1, the second data lines DL2, and the plurality of first portions DLL1. The plurality of second portions DLL2 connect the plurality of second data lines DL2 and the plurality of first portions DLL1. Accordingly, signals applied from the driver integrated circuit D-IC may be transmitted to the second data lines DL2 through the plurality of the first portions DLL1 and the plurality of second portions DLL2 disposed in the active area AA.

Accordingly, since the data link lines DLL are disposed within the active area AA, a bezel area of the display device 100 may be reduced. In the display device according to the related art, data link lines for connecting data lines disposed in the outer portion of the substrate among the plurality of data lines and the driver integrated circuit are disposed in the non-active area between the active area and the bending area. Accordingly, a reduction of the bezel area of the display device is limited, and difficulties are caused in implementing the display device with high resolution. On the other hand, in the display device 100 according to an exemplary embodiment of the present disclosure, the data link lines DLL for connecting the data lines DL disposed in the outer portion of the substrate 110 and the driver integrated circuit D-IC are disposed within the active area AA, so that the non-active area NA disposed between the active area AA and the bending area BA may be reduced, and the display device 100 with high resolution may be implemented.

Figure 3:
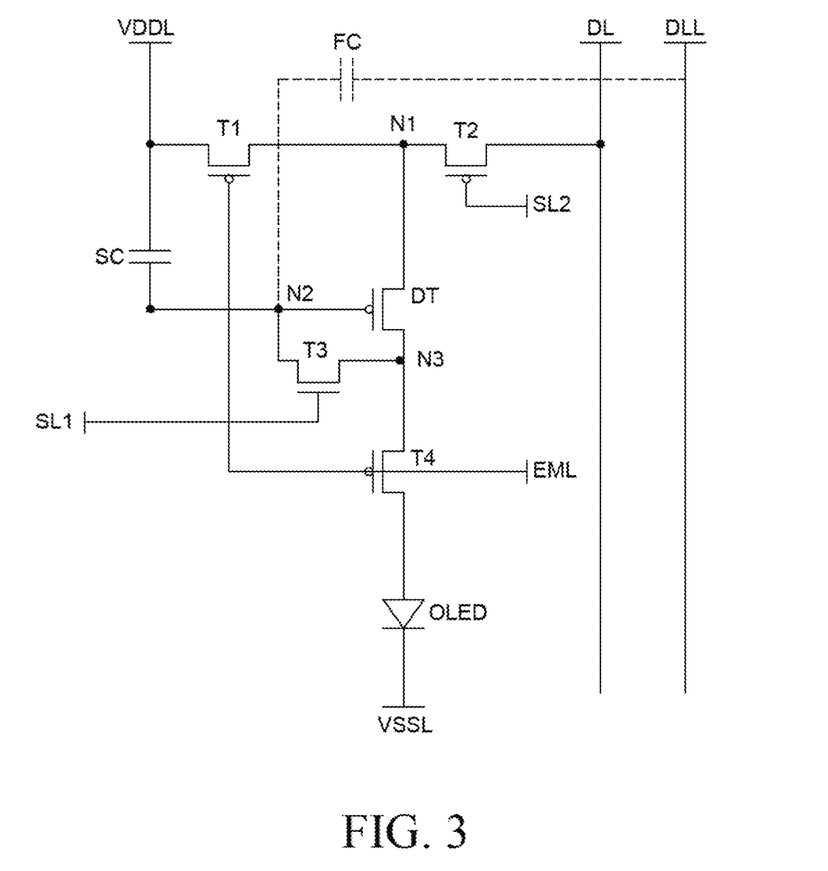
FIG. 3 is a circuit diagram of a sub-pixel of the display device according to an exemplary embodiment of the present disclosure.

FIG. 3 is a circuit diagram of a sub-pixel of the display device according to an exemplary embodiment of the present disclosure.

Referring to FIG. 3, driving circuits for driving light emitting elements OLED of the plurality of sub-pixels SP include a first transistor T1, a second transistor T2, a driving transistor DT, a third transistor T3, a fourth transistor T4, and a storage capacitor SC. To drive the driving circuit, the display device includes a plurality of lines including a first scan line SL1, a second scan line SL2, an emission signal line EML, the data line DL, the high potential power supply line VDDL, a low potential power supply line VSSL, and the data link line DLL.

Each of the first transistor T1, the second transistor T2, the third transistor T3, the fourth transistor T4, and the driving transistor DT that are included in the driving circuit of the sub-pixel SP may include a gate electrode, a source electrode, and a drain electrode.

A portion of the plurality of transistors of the driving circuit of the sub-pixel SP may be implemented as P-type transistors, and the other thereof may be implemented as N-type transistors. For example, the first transistor T1, the second transistor T2, the fourth transistor T4, and the driving transistor DT may be implemented as P-type transistors, and the third transistor T3 may be implemented as an N-type transistor, but the present disclosure is not limited thereto.

The first transistor T1, the second transistor T2, the fourth transistor T4, and the driving transistor DT, which are P-type transistors, may be low-temperature polycrystalline silicon (LTPS) thin film transistors. The third transistor T3, which is an N-type transistor, may be an oxide thin film transistor.

In the P-type transistor, since holes flow from the source electrode to the drain electrode, current may flow from the source electrode to the drain electrode. In the N-type transistor, since electrons flow from the source electrode to the drain electrode, current may flow from the drain electrode to the source electrode.

The first transistor T1 may apply a high potential power supply voltage VDD to the first node N1 that is the source electrode of the driving transistor DT. The first transistor T1 may include a gate electrode connected to the emission signal line EML, a source electrode connected to the high potential power supply line VDDL, and a drain electrode connected to the first node N1. The first transistor T1 may apply the high potential power supply voltage VDD to the first node N1 that is the source electrode of the driving transistor DT, in response to an emission signal EM of a low level that is a turn-on level.

The storage capacitor SC may maintain data voltage Vdata stored in each of the sub-pixels SP during one frame. The storage capacitor SC may include a first electrode connected to a second node N2 and a second electrode connected to the high potential power supply line VDDL. That is, the first electrode of the storage capacitor SC may be connected to the gate electrode of the driving transistor DT, and the second electrode of the storage capacitor SC may be connected to the high potential power supply line VDDL.

The second transistor T2 may apply the data voltage Vdata supplied from the data line DL to the first node N1 that is the source electrode of the driving transistor DT. The second transistor T2 may include a gate electrode connected to the second scan line SL2, a source electrode connected to the data line DL, and a drain electrode connected to the first node N1 that is the drain electrode of the first transistor T1. The second transistor T2 may apply the data voltage Vdata supplied from the data line DL to the first node N1 that is the source electrode of the driving transistor DT, in response to a second scan signal Scan2 of a low level that is a turn-on level.

The driving transistor DT may control a driving current applied to the light emitting element OLED according to a voltage Vsg between the source electrode and the gate electrode. The source electrode of the driving transistor DT may be connected to the first node N1, the gate electrode thereof may be connected to the second node N2, and the drain electrode thereof may be connected to a third node N3. Specifically, the source electrode of the driving transistor DT may be connected to the drain electrode of the first transistor T1 and the drain electrode of the second transistor T2 at the first node N1. Also, the gate electrode of the driving transistor DT may be connected to the storage capacitor SC at the second node N2. Also, the drain electrode of the driving transistor DT may be connected to the drain electrode of the third transistor T3 and the source electrode of the fourth transistor T4 at the third node N3.

The third transistor T3 may diode-connect the gate electrode and the drain electrode of the driving transistor DT. The third transistor T3 may be an oxide thin film transistor that is an N-type transistor in order to minimize leakage current. The third transistor T3 may include a drain electrode connected to the third node N3, a source electrode connected to the second node N2, and a gate electrode connected to the first scan line SL1. Specifically, the gate electrode of the third transistor T3 may be connected to the first scan line SL1, the drain electrode of the third transistor T3 may be connected to the drain electrode of the driving transistor DT and the source electrode of the fourth transistor T4, and the source electrode of the third transistor T3 may be connected to the storage capacitor SC and the gate electrode of the driving transistor DT.

The fourth transistor T4 may form a current path between the driving transistor DT and the light emitting element OLED. The fourth transistor T4 may include a source electrode connected to the third node N3, a drain electrode connected to an anode of the light emitting element OLED, and a gate electrode connected to the emission signal line EML. Specifically, the source electrode of the fourth transistor T4 may be connected to the drain electrode of the driving transistor DT and the drain electrode of the third transistor T3.

Figure 4:
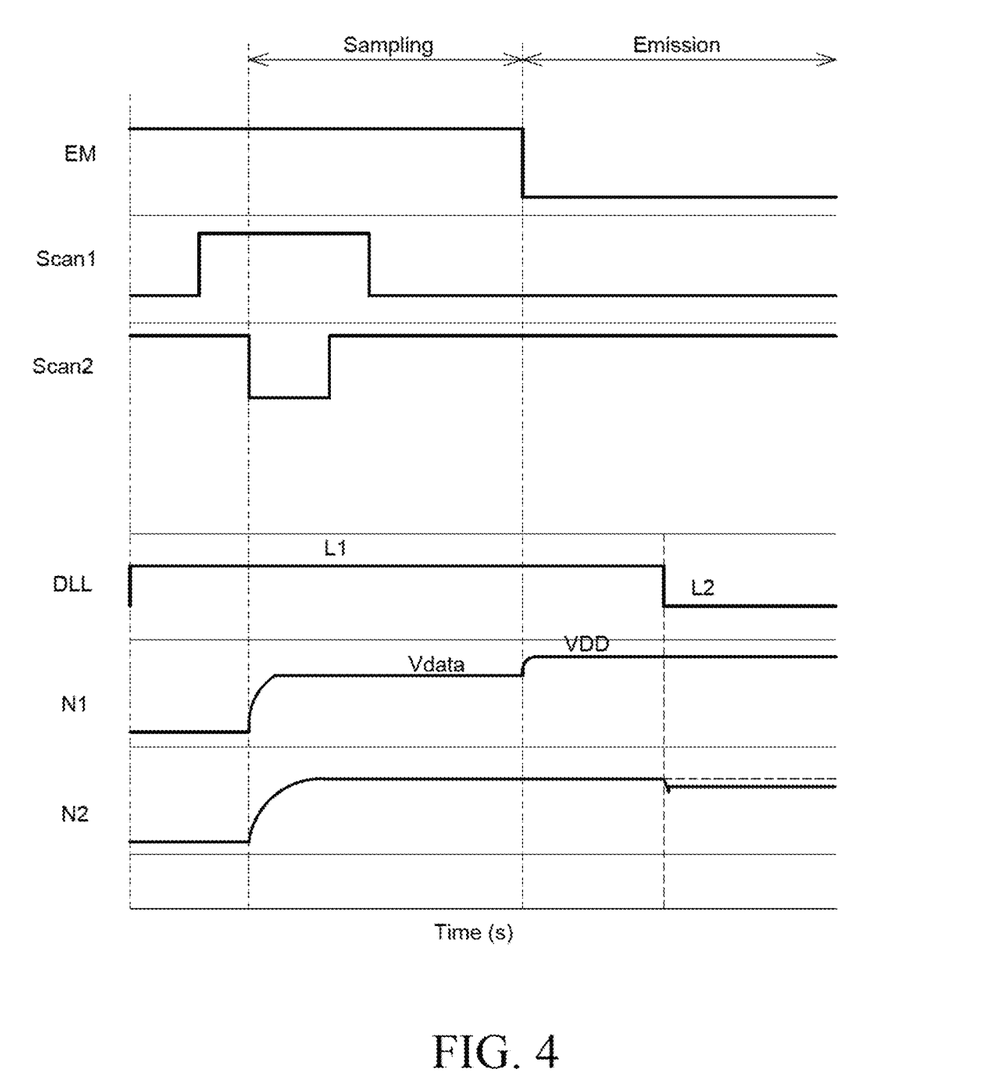
FIG. 4 is a waveform diagram illustrating signals applied to a sub-pixel of an organic light emitting display device according to an exemplary embodiment of the present disclosure during one frame.

Next, FIG. 4 is also referred to describe operations of the driving circuit of the sub-pixel SP.

FIG. 4 is a waveform diagram illustrating signals applied to the sub-pixel of the display device according to an exemplary embodiment of the present disclosure.

Referring to FIG. 4, in the display device 100 according to an exemplary embodiment of the present disclosure, one frame may be divided into a sampling period and an emission period. Although not illustrated in FIG. 4, one frame may further include an initialization period. For example, the initialization period may be a period for initializing the gate electrode of the driving transistor DT, but the present disclosure is not limited thereto.

Referring to FIG. 4, the first scan signal Scan1 transmitted through the first scan line SL1 during the sampling period may be at a high level that is a turn-on level, the second scan signal Scan2 transmitted through the second scan line SL2 may be at a low level that is a turn-on level, and the emission signal EM transmitted through the emission signal line EML may be at a high level that is a turn-off level. Accordingly, the second transistor T2, the third transistor T3, and the driving transistor DT may be turned on, while the first transistor T1 and the fourth transistor T4 may be turned off.

During the sampling period, the second transistor T2 is turned on so that the data voltage Vdata may be applied to the first node N1. In addition, since the third transistor T3 is also turned on, the driving transistor DT is in a diode connection, and the gate electrode and drain electrode of the driving transistor DT are short-circuited, so that the driving transistor DT can operate as a diode. During the sampling period, current Ids may flow between the source electrode and the drain electrode of the driving transistor DT. Since the gate electrode and the drain electrode of the driving transistor DT are in a diode connection state, a voltage of the second node N2 may rise until a voltage Vgs between the gate electrode and the source electrode of the driving transistor DT reaches a threshold voltage Vth by the current flowing from the source electrode to the drain electrode. During the sampling period, the voltage of the second node N2 with a voltage corresponding to a difference between the data voltage Vdata and the threshold voltage Vth of the driving transistor DT.

During the emission period, the first scan signal Scan1 transmitted through the first scan line SL1 may be at a low level that is a turn-off level, the second scan signal Scan2 transmitted through the second scan line SL2 may be at a high level that is a turn-off level, and the emission signal EM transmitted through the emission signal line EML may be at a low level that is a turn-on level. Accordingly, the first transistor T1, the driving transistor DT, and the fourth transistor T4 may be turned on, while the second transistor T2 and the third transistor T3 may be turned off.

During the emission period, the first transistor T1 is turned on so that the high potential power supply voltage VDD may be applied to the first node N1. In addition, the driving transistor DT and the fourth transistor T4 are turned on, so that a current path continuing to the light emitting element OLED through the driving transistor DT, the third node N3 and the fourth transistor T4 may be formed. As a result, a driving current Ioled passing through the source electrode and the drain electrode of the driving transistor DT may be applied to the light emitting element OLED.

Meanwhile, the data link line DLL may be disposed in one sub-pixel SP in which the driving circuit described above is disposed. Since the display device 100 according to an exemplary embodiment of the present disclosure is the display device 100 in which the data link lines DLL are disposed in the active area AA, one sub-pixel SP may have the data link line DLL that transmits the data voltage Vdata to other sub-pixels SP. In this case, the data voltage Vdata applied to the data link line DLL may swing at an arbitrary time point. In FIG. 4, a change in voltage at the second node N2 is described assuming that the data voltage Vdata applied to the data link line DLL is changed from a first level L1 to a second level L2 during the emission period.

During the sampling period, a voltage of the source electrode of the driving transistor DT, that is the first node N1, may rise to a level of the data voltage Vdata, and a voltage of the gate electrode of the driving transistor DT may rise to a level corresponding to the difference between the data voltage Vdata and the threshold voltage Vth of the driving transistor DT. Thereafter, during the emission period, the voltage of the source electrode of the driving transistor DT that is the first node may rise to a level of the high potential power supply voltage VDD. Since the voltage of the gate electrode of the driving transistor DT is stored in the storage capacitor SC, it can be maintained even during the emission period.

However, when the data voltage Vdata applied to the data link line DLL during the emission period drops from the first level L1 to the second level L2, voltage of the gate electrode of the driving transistor DT corresponding to the second node N2 may also be varied by a fringe capacitance FC between the data link line DLL and the second node N2. Specifically, as the data voltage Vdata applied to the data link line DLL disposed adjacent to the second node N2 varies, a coupling phenomenon may occur at the second node N2. Thus, the fringe capacitance FC may be formed between the second node N2 and the data link line DLL. Thus, as illustrated in FIG. 4, the voltage of the second node N2 should be maintained as a dotted line during the emission period, but it may be reduced to a size corresponding to a solid line. Due to the fringe capacitance FC, the voltage Vgs between the gate electrode and the source electrode of the driving transistor DT varies, resulting in cross talk, which may cause spots on a screen.

Figure 5:
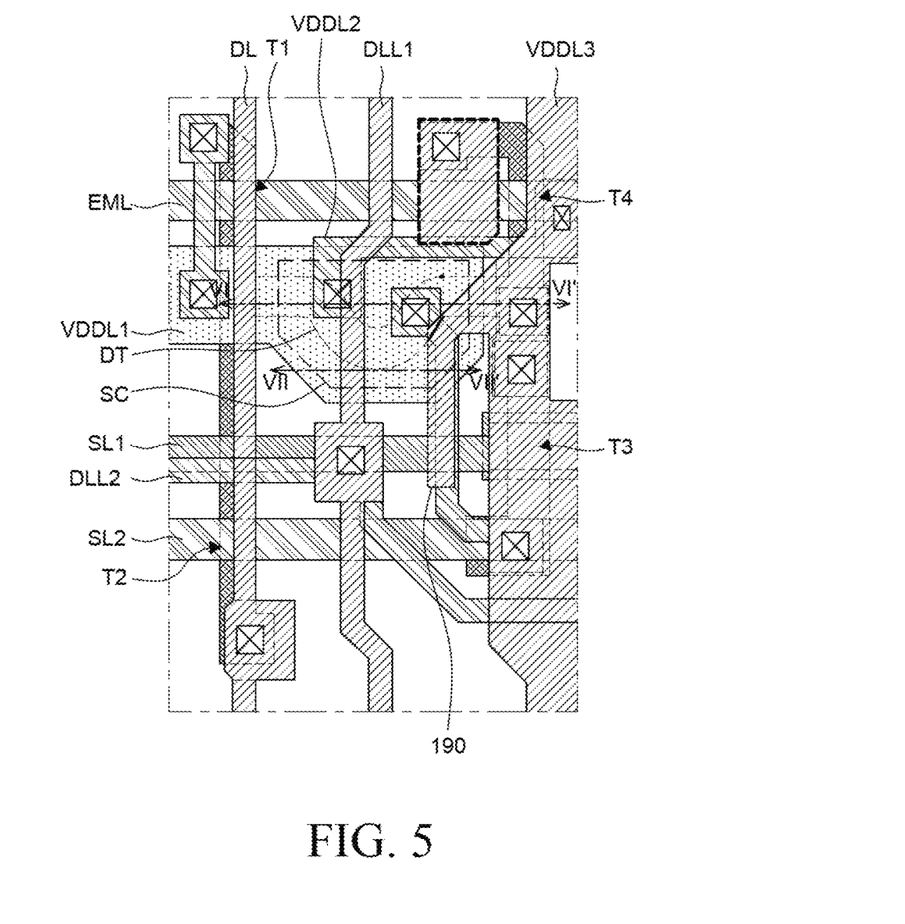
FIG. 5 is an enlarged plan view of the display device according to an exemplary embodiment of the present disclosure.
Figure 6:
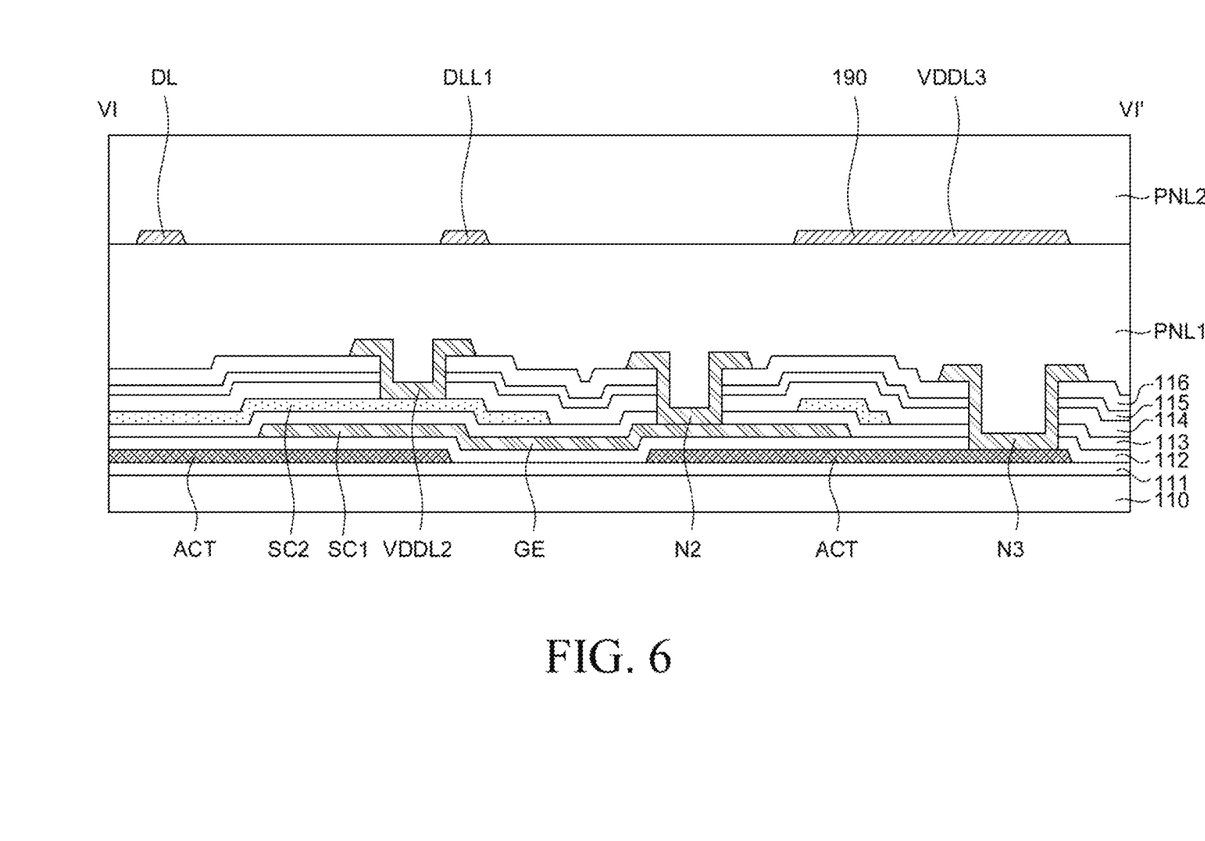
FIG. 6 is a cross-sectional view taken along VI-VI' of FIG. 5.
Figure 7:
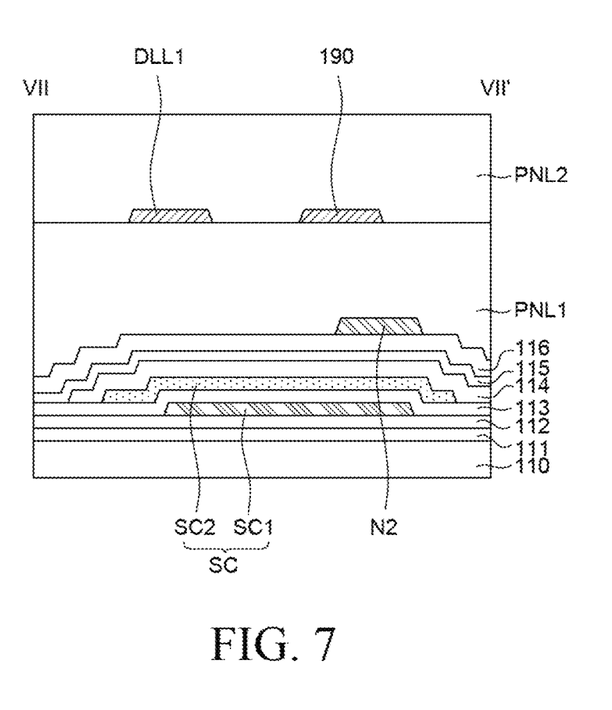
FIG. 7 is a cross-sectional view taken along VIII-VIII' of FIG. 5.

FIG. 5 is an enlarged plan view of the display device according to an exemplary embodiment of the present disclosure. FIG. 6 is a cross-sectional view taken along VI-VI' of FIG. 5. FIG. 7 is a cross-sectional view taken along VII-VII' of FIG. 5. FIG. 5 is an enlarged plan view of one sub-pixel SP. In FIG. 5, illustration of the light emitting element OLED is omitted for convenience of description. Referring to FIGS. 5 to 7, the display device 100 according to an exemplary embodiment of the present disclosure includes the substrate 110, a first planarization layer PNL1, a second planarization layer PNL2, the driving transistor DT, the first transistor T1, the second transistor T2, the third transistor T3, the fourth transistor T4, the storage capacitor SC, the first scan line SL1, the second scan line SL2, the data line DL, the high potential power supply line VDDL, and the emission signal line EML.

The plurality of sub-pixels SP may include a red sub-pixel, a green sub-pixel, a blue sub-pixel, and a white sub-pixel. For example, a red sub-pixel, a white sub-pixel, a blue sub-pixel, and a green sub-pixel may be sequentially disposed in the row direction, but an arrangement order of the plurality of sub-pixels SP is not limited thereto.

In each of the plurality of sub-pixels SP, the driving circuit including the driving transistor DT, the first transistor T1, the second transistor T2, the third transistor T3, the fourth transistor T4, and the storage capacitor SC, the plurality of high potential power supply lines VDDL, the plurality of data lines DL, a plurality of low potential power supply lines, a plurality of emission signal lines EML, the first scan line SL1, the second scan line SL2, and a bank may be disposed.

Referring to FIGS. 6 and 7, a buffer layer 111 is disposed on the substrate 110. The buffer layer 111 may prevent diffusion of moisture and/or oxygen penetrating from the outside of the substrate 110. That is, moisture permeability of the display device 100 may be controlled by controlling a thickness or laminated structure of the buffer layer 111. The buffer layer 111 may be formed of an inorganic material, and may be composed of a single layer or multilayers of, for example, silicon oxide (SiOx) or silicon nitride (SiNx), but is not limited thereto.

The driving transistor DT, the first transistor T1, the second transistor T2, the third transistor T3, the fourth transistor T4, and the storage capacitor SC are disposed in each of the plurality of sub-pixels SP on the buffer layer 111.

The driving transistor DT may include an active layer ACT, a gate electrode GE, the source electrode, and the drain electrode.

The active layer ACT of the driving transistor DT is disposed on the buffer layer 111. The active layer ACT of the driving transistor DT may include polycrystalline silicon. For example, the active layer ACT may include low-temperature polysilicon (LTPS). For example, polysilicon is formed by depositing an amorphous silicon (a-Si) material on the buffer layer 111 and performing a dehydrogenation process and a crystallization process, and the polysilicon may be patterned to form the active layer ACT.

The active layer ACT of the driving transistor DT may include a channel region, a source region, and a drain region. The source region refers to a portion of the active layer ACT connected to the source electrode, and the drain region refers to a portion of the active layer ACT connected to the drain electrode. For example, the source region and the drain region may be formed by ion doping (impurity doping) of the active layer ACT.

A first gate insulating layer 112 is disposed on the active layer ACT. The first gate insulating layer 112 is a layer for insulating the gate electrode GE and the active layer ACT, and may be formed of an insulating material. For example, the first gate insulating layer 112 may be composed of a single layer or multiple layers of silicon oxide (SiOx) or silicon nitride (SiNx), but is not limited thereto. Contact holes may be formed in the first gate insulating layer 112 to connect the source electrode and the drain electrode of the driving transistor DT to the source region and the drain region of the active layer ACT of the driving transistor DT, respectively.

The gate electrode GE is disposed on the first gate insulating layer 112 to overlap the active layer ACT. The gate electrode GE may be formed of a conductive material, for example, copper (Cu), aluminum (Al), molybdenum (Mo), nickel (Ni), titanium (Ti), chromium (Cr), or an alloy thereof, but is not limited thereto.

A first capacitor electrode SC1 may be disposed on the first gate insulating layer 112 to overlap the driving transistor DT. As illustrated in FIG. 6, the first capacitor electrode SC1 may be integrally formed with the gate electrode GE. Accordingly, the first capacitor electrode SC1 may be formed of the same material as the gate electrode GE. For example, the first capacitor electrode SC1 may be formed of copper (Cu), aluminum (Al), molybdenum (Mo), nickel (Ni), titanium (Ti), chromium (Cr), or an alloy thereof, but is not limited thereto. The first capacitor electrode SC1 may be connected to the second node N2, but is not limited thereto.

The second scan line SL2 and the emission signal line EML are disposed on the first gate insulating layer 112. The second scan line SL2 and the emission signal line EML may be formed of the same material as the gate electrode GE. For example, the second scan line SL2 and the emission signal line EML may be formed of a conductive material, for example, copper (Cu), aluminum (Al), molybdenum (Mo), nickel (Ni), titanium (Ti), chromium (Cr), or an alloy thereof, but is not limited thereto.

The second scan line SL2 may be connected to the gate electrode of the second transistor T2. The second scan line SL2 may be integrally formed with the gate electrode of the second transistor T2, but is not limited thereto.

The emission signal line EML may be connected to the gate electrode of the first transistor T1 and the gate electrode of the fourth transistor T4. The emission signal line EML may be integrally formed with the gate electrode of the first transistor T1 and the gate electrode of the fourth transistor T4, but is not limited thereto.

A first interlayer insulating layer 113 is disposed on the gate electrode GE, the first capacitor electrode SC, the second scan line SL2, and the emission signal line EML. The first interlayer insulating layer 113 may be formed of an insulating material. For example, the first interlayer insulating layer 113 may be composed of a single layer or multiple layers of silicon oxide (SiOx) or silicon nitride (SiNx), but is not limited thereto. Contact holes may be formed in the first interlayer insulating layer 113 to expose the source region and the drain region of the active layer ACT of the driving transistor DT.

A second capacitor electrode SC2 is disposed on the first interlayer insulating layer 113. The second capacitor electrode SC2 may be formed of a conductive material, for example, copper (Cu), aluminum (Al), molybdenum (Mo), nickel (Ni), titanium (Ti), chromium (Cr), or an alloy thereof, but is not limited thereto. The second capacitor electrode SC2 is disposed to overlap the first capacitor electrode SC1 and may be disposed on the driving transistor DT to overlap the driving transistor DT.

A first high potential power supply line VDDL1 is disposed on the first interlayer insulating layer 113. The first high potential power supply line VDDL1 may be disposed to be integrally formed with the second capacitor SC2 illustrated in FIG. 6, but is not limited thereto. The first high potential power supply line VDDL1 may be formed of a conductive material, for example, copper (Cu), aluminum (Al), molybdenum (Mo), nickel (Ni), titanium (Ti), chromium (Cr), or an alloy thereof, but is not limited thereto.

A second interlayer insulating layer 114 is disposed on the second capacitor electrode SC2. The second interlayer insulating layer 114 may be formed of an insulating material. For example, the second interlayer insulating layer 114 may be composed of a single layer or multiple layers of silicon oxide (SiOx) or silicon nitride (SiNx), but is not limited thereto. Contact holes may be formed in the second interlayer insulating layer 114 to expose the source region and the drain region of the active layer ACT of the driving transistor DT.

Although not illustrated in FIGS. 6 and 7, an additional buffer layer may be disposed on the second interlayer insulating layer 114. The additional buffer layer may be composed of a single layer or multiple layers of silicon oxide (SiOx) or silicon nitride (SiNx), but is not limited thereto. The third transistor T3 is disposed on the second interlayer insulating layer 114. The third transistor T3 may be disposed in an area overlapping the third high potential power supply line VDDL3.

Although not illustrated in FIGS. 6 and 7, an active layer of the third transistor T3 may be disposed on the second interlayer insulating layer 114. The active layer of the third transistor T3 may be disposed after a process of activating and hydrogenating the active layer ACT of the driving transistor DT. The active layer of the third transistor T3 may be formed of an oxide semiconductor. For example, the active layer of the third transistor T3 may be formed of various oxide semiconductors such as indium-gallium-zinc-oxide (IGZO) and the like, but is not limited thereto.

A second gate insulating layer 115 may be disposed on the active layer of the third transistor T3. The second gate insulating layer 115 may be formed of a single layer or multilayers of silicon oxide (SiOx) or silicon nitride (SiNx), but is not limited thereto. Contact holes may be formed in the second gate insulating layer 115 to connect the source electrode and the drain electrode of the driving transistor DT to the source region and the drain region of the active layer ACT of the driving transistor DT, respectively.

Although not illustrated in FIGS. 6 and 7, the gate electrode of the third transistor T3 may be disposed on the second gate insulating layer 115. The gate electrode of the third transistor T3 may be formed of a conductive material, for example, copper (Cu), aluminum (Al), molybdenum (Mo), nickel (Ni), titanium (Ti), chromium (Cr), or an alloy thereof, but is not limited thereto.

Although not illustrated in FIGS. 6 and 7, the first scan line SL1 may be disposed on the second gate insulating layer 115. The first scan line SL1 may be formed of a conductive material, for example, copper (Cu), aluminum (Al), molybdenum (Mo), nickel (Ni), titanium (Ti), chromium (Cr), or an alloy thereof, but is not limited thereto. The first scan line SL1 may be connected to the gate electrode of the third transistor T3. For example, the first scan line SL1 may be integrally formed with the gate electrode of the third transistor T3, but is not limited thereto.

A third interlayer insulating layer 116 may be disposed on the gate electrode of the third transistor T3 and the first scan line SL1. The third interlayer insulating layer 116 may be formed of an insulating material. For example, the third interlayer insulating layer 116 may be composed of a single layer or multiple layers of silicon oxide (SiOx) or silicon nitride (SiNx), but is not limited thereto. Contact holes may be formed in the third interlayer insulating layer 116 to expose the source region and the drain region of the active layer ACT of the driving transistor DT.

Although not illustrated in FIGS. 6 and 7, the source electrode and the drain electrode of the driving transistor DT may be disposed on the third interlayer insulating layer 116. The source electrode of the driving transistor DT may be connected to the active layer ACT through contact holes formed in the first gate insulating layer 112, the first interlayer insulating layer 113, the second interlayer insulating layer 114, the second gate insulating layer 115, and the third interlayer insulating layer 116. The source electrode and the drain electrode of the driving transistor DT may be formed of a conductive material, for example, copper (Cu), aluminum (Al), molybdenum (Mo), nickel (Ni), titanium (Ti), chromium (Cr), or an alloy thereof, but are not limited thereto.

Meanwhile, the drain electrode of the driving transistor DT disposed on the third interlayer insulating layer 116 may be connected to the drain electrode of the third transistor T3 and the source electrode of the fourth transistor T4. Accordingly, the drain electrode of the driving transistor DT may be referred to as the third node N3.

The second node N2 to which the drain electrode of the third transistor T3 and the gate electrode GE of the driving transistor DT are connected may be disposed on the third interlayer insulating layer 116. The second node N2 may refer to a conductive layer which is connected to the gate electrode of the driving transistor DT and to which the same potential as that of the gate electrode GE of the driving transistor DT is applied. The second node N2 may be formed of the same material as the source electrode and the drain electrode of the driving transistor DT. The second node N2 may be formed of a conductive material, for example, copper (Cu), aluminum (Al), molybdenum (Mo), nickel (Ni), titanium (Ti), chromium (Cr), or an alloy thereof, but is not limited thereto.

A second high potential power supply line VDDL2 is disposed on the third interlayer insulating layer 116. The second high potential power supply line VDDL2 may connect the first high potential power supply line VDDL1 and the third high potential power supply line VDDL3. The second high potential power supply line VDDL2 may be formed of the same material as the source electrode and the drain electrode of the driving transistor DT. The second high potential power supply line VDDL2 may be formed of a conductive material, for example, copper (Cu), aluminum (Al), molybdenum (Mo), nickel (Ni), titanium (Ti), chromium (Cr), or an alloy thereof, but is not limited thereto. Also, referring to FIG. 6, the second high potential power supply line VDDL2 may be disposed to overlap the storage capacitor SC on the second capacitor electrode SC2.

The second portion DLL2 of the data link line DLL may be disposed on the third interlayer insulating layer 116. The second portion DLL2 of the data link line DLL may be formed of the same material as the source electrode and the drain electrode of the driving transistor DT. The second portion DLL2 may be formed of a conductive material, for example, copper (Cu), aluminum (Al), molybdenum (Mo), nickel (Ni), titanium (Ti), chromium (Cr), or an alloy thereof, but is not limited thereto.

The second portion DLL2 of the data link line DLL is disposed to cross the first portion DLL1 of the data link line DLL on the substrate 110, and may be electrically connected to the first portion DLL1 of the data link line DLL.

The first planarization layer PNL1 is disposed on the source electrode and the drain electrode of the driving transistor DT, the second high potential power supply line VDDL2, and the second portion DLL2. The first planarization layer PNL1 is an insulating layer that planarizes an upper portion of the substrate 110. The first planarization layer PNL1 may be formed of an organic material, and may be composed of a single layer or multilayers of for example, polyimide or photoacryl, but is not limited thereto.

The data line DL, the first portion DLL1 of the data link line DLL, and the third high potential power supply line VDDL3 are disposed on the first planarization layer PNL1.

The data line DL is disposed on the first planarization layer PNL1. The data line DL may be formed of a conductive material, for example, copper (Cu), aluminum (Al), molybdenum (Mo), nickel (Ni), titanium (Ti), chromium (Cr), or an alloy thereof, but is not limited thereto.

Referring to FIG. 5, the data line DL extends in the column direction and is connected to the source electrode of the second transistor T2 to apply a data voltage to the driving transistor DT.

Meanwhile, the data line DL illustrated in FIGS. 5 to 7 may extend from the driver integrated circuit D-IC and be connected to the sub-pixel SP without a separate link line. Accordingly, the data line DL illustrated in FIGS. 5 to 7 may be the first data line DL1.

The first portion DLL1 of the data link line DLL is disposed on the first planarization layer PNL1. The first portion DLL1 of the data link line DLL may be formed of the same material as the data line DL. The first portion DLL1 of the data link line DLL may be formed of a conductive material, for example, copper (Cu), aluminum (Al), molybdenum (Mo), nickel (Ni), titanium (Ti), or chromium (Cr) or an alloy thereof, but is not limited thereto.

Referring to FIG. 5, the first portion DLL1 may be disposed to extend in the column direction like the data line DL. In this case, referring to FIG. 6, the first portion DLL1 may be disposed between the data line DL and the third high potential power supply line VDDL3 on the first planarization layer PNL1.

Meanwhile, the first portion DLL1 of the plurality of data link lines DLL may be disposed above the driving transistor DT to overlap the driving transistor DT. For example, the first portion DLL1 extending in the column direction may be disposed to overlap a plurality of the driving transistors DT disposed in the same column.

Meanwhile, the first portion DLL1 may be insulated from the plurality of driving transistors DT disposed to overlap at a lower portion thereof. In addition, the first portion DLL1 may receive different data signals from the plurality of driving transistors DT disposed in the same column as the first portion DLL1. For example, when the first portion DLL1 is disposed on the driving transistors DT disposed in a first column, the first portion DLL1 disposed in the first column may apply data signals to the driving transistors DT disposed in columns different from the first column through the second portion DLL2. Accordingly, the data link line DLL among the plurality of data link lines DLL, that is disposed to overlap the driving transistor DT may transmit a data signal to the sub-pixel SP different from the sub-pixel SP in which the driving transistor DT is disposed.

The third high potential power supply line VDDL3 is disposed on the first planarization layer PNL1. The third high potential power supply line VDDL3 may be formed of the same material as the first portion DLL1 of the data link line DLL and the data line DL. The third high potential power supply line VDDL3 may be formed of a conductive material, for example, copper (Cu), aluminum (Al), molybdenum (Mo), nickel (Ni), titanium (Ti), chromium (Cr), or an alloy thereof, but is not limited thereto.

Referring to FIG. 5, the third high potential power supply line VDDL3 may be disposed to extend in the column direction, like the first portion DLL1 and the data line DL. In this case, referring to FIGS. 5 and 6, the third high potential power supply line VDDL3 may be disposed to overlap the third node N3.

Referring to FIGS. 5 and 7, a shielding layer 190 is disposed on the first planarization layer PNL1. The shielding layer 190 may be formed of the same material as the third high potential power supply line VDDL3, the first portion DLL1 of the data link line DLL, and the data line DL. The shielding layer 190 may be formed of a conductive material, for example, copper (Cu), aluminum (Al), molybdenum (Mo), nickel (Ni), titanium (Ti), chromium (Cr), or an alloy thereof, but it is not limited thereto.

Referring to FIG. 5, the shielding 190 is disposed on the driving transistor DT. The shielding layer is connected to the gate electrode of the driving transistor. For example, as illustrated in FIGS. 5 and 7, the shielding layer 190 is disposed to overlap the second node N2 having the same potential as the gate electrode of the driving transistor DT.

Referring to FIGS. 5 and 6, the shielding layer 190 may be electrically connected to the third high potential power supply line VDDL3. When the shielding layer 190 is integrally formed with the third high potential power supply line VDDL3, the shielding layer 190 may may extend from the third high potential power supply line VDDL3 and be disposed to overlap the second node N2, as illustrated in FIG. 5. Thus, a constant voltage, which is a high potential power source, may be applied to the shielding layer 190, and the shielding layer 190 may reduce variations in voltage of the second node N2 due to voltage changes of the plurality of data link lines DLL during the emission period.

The second planarization layer PNL2 is disposed on the data line DL, the first portion DLL1 of the data link line DLL, the third high potential power supply line VDDL3, and the shielding layer 190. The second planarization layer PNL2 is an insulating layer planarizing the upper portion of the the upper substrate 110. The second planarization layer PNL2 may be formed of an organic material. The second planarization layer PNL2 may be composed of a single layer or multilayers of, for example, polyimide or photoacryl, but is not limited thereto.

Meanwhile, although not illustrated in the drawings, the light emitting device OLED including the anode, a light emitting layer, and a cathode may be disposed on the second planarization layer PNL2. The light emitting element OLED may be connected to the drain electrode of the fourth transistor T4 and emit light according to a data signal applied to the data line DL.

A display device in which link lines for connecting an external circuit and a driving circuit disposed in the non-active area NA and the plurality of sub-pixels SP disposed in the active area AA are disposed in the non-active area NA is used. For example, when the driving circuit and the external circuit are bent toward a rear surface of the substrate 110, a plurality of link lines are disposed in the bending area BA and the non-active area NA disposed between the bending area BA and the active area AA. However, in the case of the link line that is disposed obliquely to connect the data line DL and the driver integrated circuit D-IC disposed in the outer portion of the substrate 110, it is vulnerable to stress and may be damaged. Accordingly, the plurality of link lines are disposed in the non-active area NA disposed between the bending area BA and the active area AA. Thus, as the link lines are disposed in the non-active area NA, a reduction of a bezel area of the display device 100 is restricted.

Accordingly, in order to reduce the bezel area of the display device 100, the link line is disposed inside the active area AA of the display device 100. For example, the first data lines DL1 extending linearly from the driver integrated circuit D-IC and connected to the plurality of sub-pixels SP, and the second data lines DLL2 extending linearly from the driver integrated circuit D-IC and connected to the plurality of sub-pixels SP through the plurality of data link lines DLL are disposed in the active area AA. Accordingly, as the data link lines DLL are disposed in the active area AA, the bezel area of the display device 100 is reduced. However, on the sub-pixels SP disposed in the column direction, as the data link line DLL for transferring the data voltage Vdata to other sub-pixels SP is disposed, a parasitic capacitance occurs between the driving transistor DT disposed in the sub-pixel SP and the data link line DLL disposed to overlap the driving transistor DT. For example, a data signal different from that of the data line DL connected to the driving transistor DT may be applied to the data link line DLL disposed to overlap the driving transistor DT. Accordingly, as the data link line DLL (to which a signal varying at a point different from the second node N2 is applied) is above the driving transistor DT, a parasitic capacitance may be formed at the second node N2. Accordingly, the voltage between the gate electrode and the source electrode of the driving transistor DT is varied by the parasitic capacitance between the data link line DLL and the second node N2, and a difference in luminance may occur, and spots on a screen may occur.

Accordingly, in the display device 100 according to an exemplary embodiment of the present disclosure, a parasitic capacitance generated between the second node N2 and the data link line DLL may be reduced by disposing the high potential power supply line VDDL on the second node N2. Specifically, among the lines disposed adjacent to the second node N2, the high potential power supply line VDDL to which the constant voltage is applied is extended and disposed to overlap the second node N2. Accordingly, the parasitic capacitance occurring between the second node N2 and the data link line DLL disposed adjacent to the second node N2 can be minimized, and a variation in the voltage Vgs between the gate electrode and the source electrode of the driving transistor DT can be reduced. Therefore, in the display device 100 according to an exemplary embodiment of the present disclosure, the occurrence of spots on a screen can be reduced by decreasing a difference in luminance due to the variation of the second node N2.

The exemplary embodiments of the present disclosure can also be described as follows:

According to an aspect of the present disclosure, there is provided a display device. The display device comprises a substrate including an active area including a plurality of sub-pixels and a non-active area, a plurality of light emitting elements disposed in the plurality of sub-pixels, a plurality of data lines disposed in the active area, a plurality of data link lines disposed in the active area and transmitting a data voltage to the plurality of data lines, driving transistors disposed in the plurality of sub-pixels and a shielding layer disposed over the driving transistors, wherein the shielding layer is connected to a gate electrode of the driving transistor and is disposed to overlap a conductive layer having the same potential as the gate electrode of the driving transistor.

The plurality of data link lines may overlap the driving transistor.

Among the plurality of data link lines, a data link line disposed to overlap the driving transistor may transmit a data signal to a sub-pixel different from a sub-pixel in which the driving transistor is disposed.

The display device of claim 3, wherein the plurality of data link lines include a plurality of first portions disposed between the data lines of the plurality of data lines disposed in the central portion of the substrate and a plurality of second portions connected to the plurality of first portions and disposed in a direction crossing the plurality of data lines.

The shielding layer may be disposed on the same layer as the plurality of data link lines.

A constant voltage may be applied to the shielding layer.

A high potential power may be applied to the shielding layer.

The shielding layer may extend from a high potential power supply line.

A plurality of pixel circuits disposed in the plurality of sub-pixels may include a first transistor including a source electrode connected to a high potential power supply line and a gate electrode connected to an emission signal line, a capacitor connected to the high potential power supply line, a second transistor including a source electrode connected to the plurality of data line, a drain electrode connected to the first transistor, and a gate electrode connected to a second scan line, the driving transistor having a source electrode connected to the drain electrode of the first transistor and the drain electrode of the second transistor at a first node, and including a gate electrode connected to the capacitor, a third transistor including a source electrode connected to a gate electrode of the driving transistor and the capacitor at a second node, a drain electrode connected to the drain electrode of the driving transistor at a third node, and a gate electrode connected to the second scan line and a fourth transistor having a source electrode connected to the drain electrode of the driving transistor and the drain electrode of the third transistor at the third node, a drain electrode connected to the light emitting element, and a gate electrode connected to the emission signal line.

The second node is said conductive layer having the same potential as the gate electrode of the driving transistor, and, the shielding layer may be disposed to overlap the second node.

The shielding layer may be connected to the high potential power supply line to reduce a variation in voltage of the second node due to voltage changes of the plurality of data link lines during an emission period.

The first transistor, the second transistor, the fourth transistor, and the driving transistor are P-type transistors, and the third transistor is N-type transistor.

The high potential power supply line is disposed on the second node such that a parasitic capacitance generated between the second node and the data link line is reduced.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
    a substrate including an active area including a plurality of sub-pixels and a non-active area;
    a plurality of light emitting elements disposed in the plurality of sub-pixels;
    a plurality of data lines disposed in the active area;
    a plurality of data link lines disposed in the active area and for transmitting a data voltage to the plurality of data lines;
    driving transistors disposed in the plurality of sub-pixels; and
    a shielding layer disposed over the driving transistors,
    wherein the shielding layer is disposed to overlap a conductive layer which is connected to a gate electrode of the driving transistor and which is configured to have a same potential as the gate electrode of the driving transistor.

2. The display device of claim 1, wherein the plurality of data link lines overlap the driving transistor.

3. The display device of claim 2, wherein, among the plurality of data link lines, a data link line disposed to overlap the driving transistor transmits a data signal to a sub-pixel different from a sub-pixel in which the driving transistor is disposed.

4. The display device of claim 3, wherein the plurality of data link lines include a plurality of first portions disposed between the data lines of the plurality of data lines disposed in a central portion of the substrate and a plurality of second portions connected to the plurality of first portions and disposed in a direction crossing the plurality of data lines.

5. The display device of claim 1, wherein the shielding layer is disposed on the same layer as the plurality of data link lines.

6. The display device of claim 1, wherein a constant voltage is applied to the shielding layer.

7. The display device of claim 6, wherein a high potential power is applied to the shielding layer.

8. The display device of claim 7, wherein the shielding layer extends from a high potential power supply line.

9. The display device of claim 1, wherein a plurality of pixel circuits disposed in the plurality of sub-pixels include,
    a first transistor including a source electrode connected to a high potential power supply line and a gate electrode connected to an emission signal line;
    a capacitor connected to the high potential power supply line;
    a second transistor including a source electrode connected to the plurality of data lines, a drain electrode connected to the first transistor, and a gate electrode connected to a second scan line;
    the driving transistor having a source electrode connected to the drain electrode the first transistor and drain electrode of the second transistor at a first node, and including a gate electrode connected to the capacitor;
    a third transistor including a source electrode connected to a gate electrode of the driving transistor and the capacitor at a second node, a drain electrode connected to the drain electrode of the driving transistor at a third node, and a gate electrode connected to the second scan line; and
    a fourth transistor having a source electrode connected to the drain electrode of the driving transistor and the drain electrode of the third transistor at the third node, a drain electrode connected to the light emitting element, and a gate electrode connected to the emission signal line.

10. The display device of claim 9, wherein the second node is said conductive layer having the same potential as the gate electrode of the driving transistor, and the shielding layer is disposed to overlap the second node.

11. The display device of claim 9, wherein the shielding layer is connected to the high potential power supply line to reduce a variation in voltage of the second node due to voltage changes of the plurality of data link lines during an emission period.

12. The display device of claim 9, wherein the first transistor, the second transistor, the fourth transistor, and the driving transistor are P-type transistors, and the third transistor is N-type transistor.

13. The display device of claim 9, wherein the high potential power supply line is disposed on the second node such that a parasitic capacitance generated between the second node and the data link line is reduced.

* * * * *